US011305373B2

(12) United States Patent
Mayberry et al.

(10) Patent No.: US 11,305,373 B2
(45) Date of Patent: Apr. 19, 2022

(54) ULTRASONIC ADDITIVELY MANUFACTURED COLDPLATES ON HEAT SPREADERS

(71) Applicant: Raytheon Company, Waltham, MA (US)

(72) Inventors: Travis L. Mayberry, Dallas, TX (US); Craig H. McCordic, Medfield, MA (US); Joseph R. Ellsworth, Worcester, MA (US)

(73) Assignee: Raytheon Company, Waltham, MA (US)

( * ) Notice: Subject to any disclaimer, the term of this patent is extended or adjusted under 35 U.S.C. 154(b) by 92 days.

(21) Appl. No.: 16/668,193

(22) Filed: Oct. 30, 2019

(65) Prior Publication Data

US 2021/0129261 A1    May 6, 2021

(51) Int. Cl.
| | | |
|---|---|---|
| B23K 20/10 | (2006.01) | |
| H01L 21/48 | (2006.01) | |
| H01L 23/427 | (2006.01) | |
| B33Y 70/00 | (2020.01) | |
| B33Y 80/00 | (2015.01) | |
| B33Y 10/00 | (2015.01) | |
| H01L 23/367 | (2006.01) | |
| B23K 103/10 | (2006.01) | |

(52) U.S. Cl.
CPC ............ *B23K 20/10* (2013.01); *B23K 20/103* (2013.01); *B23K 20/106* (2013.01); *B33Y 10/00* (2014.12); *B33Y 70/00* (2014.12); *B33Y 80/00* (2014.12); *H01L 21/4871* (2013.01); *H01L 21/4882* (2013.01); *H01L 23/367* (2013.01); *H01L 23/3672* (2013.01); *H01L 23/3675* (2013.01); *H01L 23/427* (2013.01); *B23K 2103/10* (2018.08)

(58) Field of Classification Search
CPC .... B23K 20/10; B23K 20/103; B23K 20/106; H01L 23/3675; H01L 23/367; H01L 23/3672; H01L 21/4871; H01L 21/4882
See application file for complete search history.

(56) References Cited

U.S. PATENT DOCUMENTS

| | | | |
|---|---|---|---|
| 6,650,215 B1 * | 11/2003 | Gundale | ............ B23K 20/103 336/61 |
| 7,273,090 B2 | 9/2007 | Crocker | |
| 8,089,767 B2 | 1/2012 | Busch | |
| 8,482,921 B2 | 7/2013 | Cai | |
| 8,522,861 B2 | 9/2013 | Zaffetti | |
| 8,804,337 B2 | 8/2014 | Zaffetti | |
| 9,307,674 B2 | 4/2016 | Chainer | |

(Continued)

OTHER PUBLICATIONS

International Search Report and Written Opinion dated Jun. 7, 2021 in corresponding International Applicaiton No. PCT/US2020/057628.

*Primary Examiner* — Bac H Au
(74) *Attorney, Agent, or Firm* — Renner, Otto, Boisselle & Sklar, LLP

(57) ABSTRACT

A method of forming a cooling structure for a heat-dissipating surface includes arranging a heat spreader layer adjacent the heat-dissipating surface, bonding a coldplate directly to the heat spreader layer opposite the heat-dissipating surface, and forming an intermetallic bond between the heat spreader layer and the coldplate. The coldplate is bonded to the heat spreader layer using ultrasonic additive manufacturing.

14 Claims, 5 Drawing Sheets

(56) References Cited

U.S. PATENT DOCUMENTS

| | | | |
|---|---|---|---|
| 2012/0050994 A1* | 3/2012 | Boday | F16L 11/04 |
| | | | 361/702 |
| 2013/0327508 A1 | 12/2013 | Zaffetti | |
| 2015/0007969 A1 | 1/2015 | Pal | |
| 2016/0114439 A1 | 4/2016 | Pal | |
| 2016/0143186 A1* | 5/2016 | Dixler | H05K 7/20963 |
| | | | 361/700 |
| 2016/0322280 A1* | 11/2016 | Schmit | H01L 23/043 |
| 2017/0186667 A1* | 6/2017 | Choudhury | H01L 23/473 |
| 2017/0356698 A1* | 12/2017 | Andersen | H01L 21/4871 |
| 2018/0158756 A1* | 6/2018 | Smoot | H01L 21/4871 |
| 2018/0166359 A1* | 6/2018 | Fukuoka | H01L 23/3738 |
| 2019/0082560 A1 | 3/2019 | Dede et al. | |
| 2019/0385933 A1* | 12/2019 | Eid | H01L 23/3677 |
| 2020/0035642 A1* | 1/2020 | Egusa | B06B 3/00 |
| 2020/0105643 A1* | 4/2020 | Wan | H01L 23/3672 |

\* cited by examiner

ULTRASONIC ADDITIVELY MANUFACTURED COLDPLATES ON HEAT SPREADERS

FIELD OF THE INVENTION

The invention relates to structures manufactured using ultrasonic additive manufacturing, and more particularly, forming a cooling structure having a heat spreader and a coldplate that is directly bonded to the heat spreader material.

DESCRIPTION OF THE RELATED ART

Many applications use cooling structures or manifolds for cooling a heat-dissipating surface. A conventional cooling method includes using forced convection coldplates that are in contact with a heat-dissipating surface. However, using only forced convection coldplates may not be suitable for use in some applications, such as in high-power electronics having chips that dissipate an extremely high heat flux.

Attempts have been made to provide cooling for chips in high-power electronics applications. One attempt includes providing a heat spreader material for spreading heat across a surface area that is larger than the surface area of the heat-dissipating surface prior to cooling using forced convection in the coldplate. The heat spreader material is bonded to the coldplate using a thermal interface material arranged between the coldplate and the heat spreader material. However, using the thermal interface material is disadvantageous due to the thermal resistance caused by the material inherently having at least an order of magnitude of thermal conductivity that is lower as compared with the heat spreader material and the coldplate. Accordingly, using the thermal interface material causes bottlenecking in heat transfer and large temperature rises which are especially detrimental for high-power electronics.

SUMMARY OF THE INVENTION

Ultrasonic additive manufacturing (UAM) is advantageous in forming a cooling or manifold structure for a heat-dissipating surface, such as in an integrated circuit for high-power electronics. Using UAM to directly bond a coldplate to a heat spreader layer that is arranged adjacent the heat-dissipating surface is advantageous in eliminating the thermal interface material and reducing the temperature rise between the heat-dissipating surface and the working fluid in the coldplate. Reducing the temperature rise consequently enables the electronic device having the heat-dissipating surface to operate more efficiently due to the increased cooling for the circuitry.

UAM enables an intermetallic bond to be formed between the heat spreader layer and the coldplate and also enables the use of dissimilar metals or multi-material laminates. In contrast, the materials available for UAM are not suitable for use in conventional manufacturing methods. UAM may further be used to build up the coldplate. The coldplate may include laminated metal layers and serpentine cooling channels with finstock. The serpentine cooling channels and finstock may be milled or formed by UAM.

The heat spreader layer has a surface area that is greater than the surface area of the heat-dissipating surface and different types of heat spreaders may be suitable for bonding with the coldplate. The method of forming the cooling structure may include using an existing heat spreader, such as a solid-state structure or a two-phase assembly having vapor chambers or heat pipe assemblies, and bonding the coldplate directly to the existing heat spreader. In other embodiments, the method may include building up the heat spreader layer with sublayers using UAM.

According to an aspect of the invention, a method of forming a cooling structure for a heat-dissipating surface includes bonding a coldplate directly to a heat spreader.

According to an aspect of the invention, a method of forming a cooling structure for a heat-dissipating surface includes forming a coldplate on a heat spreader using UAM.

According to an aspect of the invention, a method of forming a cooling structure for a heat-dissipating surface includes forming an intermetallic bond between a heat spreader and a coldplate.

According to an aspect of the invention, a method of forming a cooling structure for a heat-dissipating surface includes arranging a heat spreader layer adjacent the heat-dissipating surface, bonding a coldplate directly to the heat spreader layer opposite the heat-dissipating surface, and forming an intermetallic bond between the heat spreader layer and the coldplate.

According to an embodiment of any paragraph(s) of this summary, bonding the coldplate directly to the heat spreader layer may include using ultrasonic additive manufacturing.

According to an embodiment of any paragraph(s) of this summary, forming the intermetallic bond may include forming a metal-to-metal contact between at least two of aluminum, copper, molybdenum, tungsten, and silicon carbide.

According to an embodiment of any paragraph(s) of this summary, forming the coldplate may include using ultrasonic additive manufacturing.

According to an embodiment of any paragraph(s) of this summary, the method may include building up the heat spreader and the coldplate in a direction that is normal to the heat-dissipating surface.

According to an embodiment of any paragraph(s) of this summary, the method may include forming serpentine cooling channels in the coldplate.

According to an embodiment of any paragraph(s) of this summary, the method may include forming a first metal sublayer adjacent the heat spreader layer, a flow passage, and a second metal sublayer layer over the flow passage.

According to an embodiment of any paragraph(s) of this summary, the method forming the first metal sublayer layer and the second metal sublayer of aluminum laminates.

According to an embodiment of any paragraph(s) of this summary, the method may include machining finstock in the serpentine cooling channels.

According to an embodiment of any paragraph(s) of this summary, the method may include separately forming finstock and permanently joining the finstock in the serpentine cooling channels.

According to an embodiment of any paragraph(s) of this summary, the method may include forming the heat spreader layer having a plurality of sublayers using ultrasonic additive manufacturing.

According to an embodiment of any paragraph(s) of this summary, the method may include arranging the heat spreader layer adjacent an integrated circuit that includes the heat-dissipating surface.

According to another aspect of the invention, a cooling structure for a heat-dissipating surface includes a heat spreader layer arranged adjacent the heat-dissipating surface, and a coldplate that is bonded directly to the heat spreader layer opposite the heat-dissipating surface, wherein the heat spreader layer and the coldplate have an intermetallic bond.

According to an embodiment of any paragraph(s) of this summary, the intermetallic bond may include metal-to-metal contact between at least two of aluminum, copper, molybdenum, tungsten, and silicon carbide.

According to an embodiment of any paragraph(s) of this summary, the coldplate may include a plurality of serpentine cooling channels.

According to an embodiment of any paragraph(s) of this summary, the coldplate may include finstock arranged in the serpentine cooling channels.

According to an embodiment of any paragraph(s) of this summary, the heat spreader layer may have a surface area that is greater than the heat-dissipating surface.

According to an embodiment of any paragraph(s) of this summary, the heat spreader layer may be a two-phase cooling subassembly including a vapor chamber.

According to an embodiment of any paragraph(s) of this summary, the heat spreader layer may be a two-phase cooling subassembly including a heat pipe.

According to an embodiment of any paragraph(s) of this summary, the heat spreader layer may be solid-state and include one of a copper/molybdenum/copper (CMC) heat spreader, a super CMC heat spreader, or a thermal pyrolytic graphite (TPG) heat spreader.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein have particular application in a cooling structure or manifold used for cooling a heat-dissipating surface to which the cooling structure is attached. A cooling structure may include a heat spreader layer and a coldplate. Various applications may implement a cooling structure such as high-power electronics having integrated circuits or chips that dissipate a high heat flux. High power electronics and the corresponding cooling structure for the electronics may be used in aerospace applications, military applications, and commercial wireless, high-power amplifier applications. The cooling structure described herein may be implemented in many other applications.

Ultrasonic additive manufacturing (UAM) is advantageous in forming cooling structures due to the capabilities of UAM in producing complex internal features within metallic materials and the materials available for UAM. Using UAM is advantageous in forming intermetallic bonding that includes bonding between dissimilar metal materials and multi-material laminates that retain original material properties. Using UAM to bond a coldplate directly to a heat spreader material eliminates the use of a thermal interface material between the coldplate and the heat spreader material and reduces the temperature rise between the heat-dissipating surface and the working fluid in the coldplate.

Figure 1:
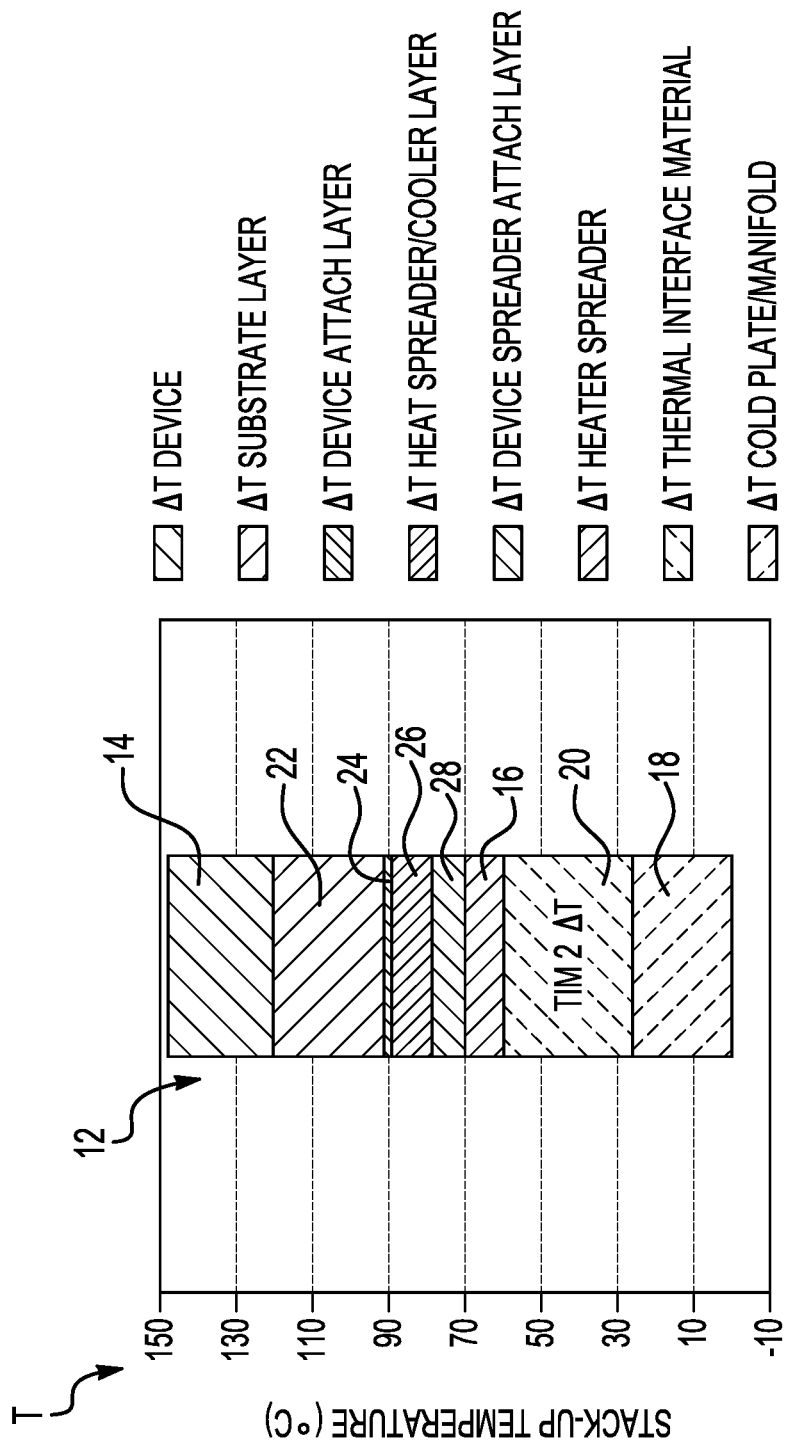
FIG. 1 shows a conventional cooling structure having a heat-dissipating surface, a heat spreader layer, a coldplate, and a thermal interface material arranged between the heat spreader layer and the coldplate.

Referring first to FIG. 1, a conventional cooling structure 12 for a heat-dissipating surface 14 is shown. The heat-dissipating surface 14 may be part of an electronic device, such as an integrated circuit. The conventional cooling structure 12 includes a heat spreader layer 16, a coldplate 18, and a thermal interface material 20 interposed between the heat spreader layer 16 and the coldplate 18 for bonding the heat spreader layer 16 to the coldplate 18. The heat spreader layer 16 may be formed of an alloy of copper and molybdenum. The conventional cooling structure 12 includes additional layers between the heat-dissipating surface 14 and the heat spreader layer 16 such as a device substrate layer 22, a device attach layer 24, a heat spreader or cooler layer 26, and a heat spreader attach layer 28. Different cooling structures 12 may have different arrangements of the layers that are dependent on the application.

The temperature T through the cooling structure 12 decreases across the cooling structure 12 from the heat-dissipating surface 14 to the coldplate 18, such as from approximately 150 degrees Celsius to approximately zero degrees Celsius. Using the thermal interface material 20 is disadvantageous in that the thermal interface material 20 causes a thermal resistance due to the lower thermal conductivity relative to the heat spreader layer 16 and the coldplate 18. As shown in FIG. 1, using the thermal interface material 20 may cause large temperature rises, such as twice as much, which is particularly disadvantageous in the operation of high-power electronics.

Figure 2:
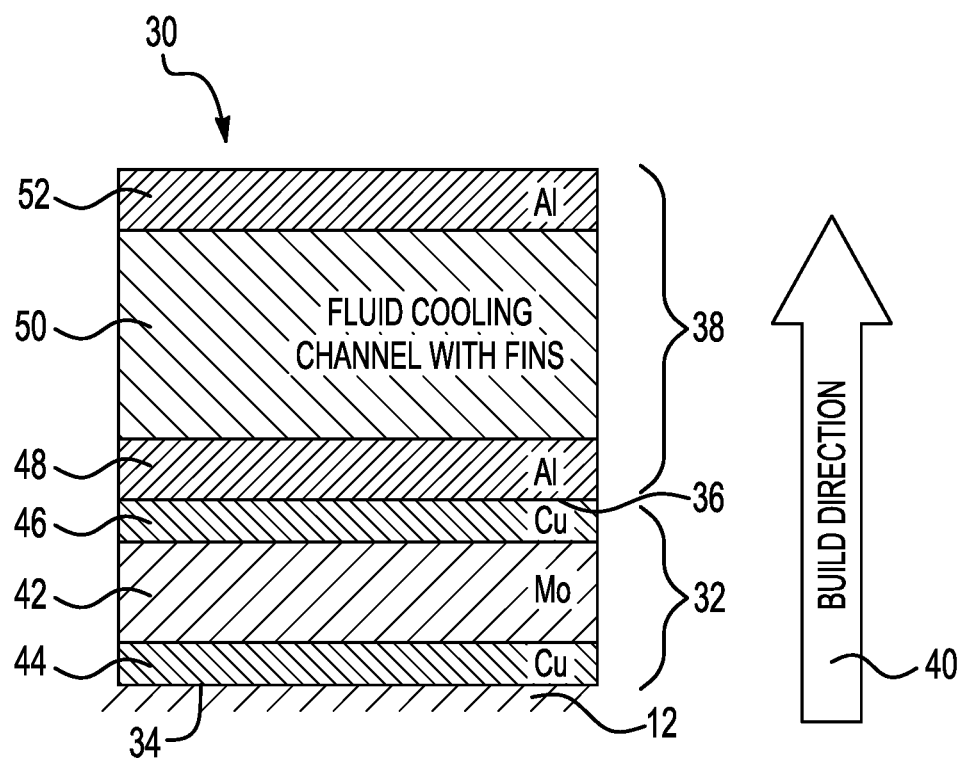
FIG. 2 shows a cooling structure according to an embodiment of the present application in which the coldplate is directly bonded to the heat spreader layer.

Referring now to FIG. 2, a cooling structure 30 for the heat-dissipating surface 14 according to the present application is shown. The heat-dissipating surface 14 may include the integrated circuit of FIG. 1. The cooling structure 30 includes a heat spreader layer 32 having a first side 34 that is arranged adjacent the heat-dissipating surface 14 and a second side 36 that opposes the first side 34. A coldplate 38 is bonded to the second side 36 of the heat spreader layer 32. The heat spreader layer 32 has a surface area that is greater than the surface area of the heat-dissipating surface 14 for spreading the heat prior to cooling with forced convection in the coldplate 38. The heat spreader layer 32 and the coldplate 38 are both substantially planar and extend in a same direction, such that the cooling structure 30 has a vertically stacked arrangement including the heat spreader layer 32 and the coldplate 38.

UAM is used to bond the coldplate 38 directly to the heat spreader layer 32 and may also be used to build up the coldplate 38 over the heat spreader layer 32. UAM may also be used to build up the heat spreader layer 32. The cooling structure 30 may be applied or built up in a build direction 40 that is normal to the direction in which the heat-dissipating surface 14 extends and normal to the direction in which a working fluid may flow through the coldplate 38. Other additive manufacturing processes, such as electron beam melting, may also be suitable for forming the coldplate 38. UAM is used to form an intermetallic bond, or metal-to-metal contact between the heat spreader layer 32 and the coldplate 38. The intermetallic bond may be an intermetallic compound that occurs in an extremely thin layer between different materials. Each of the heat spreader layer 32 and the coldplate 38 may be formed of a plurality of stacked planar sublayers. The heat spreader layer 32 may include sublayers 42, 44, 46 and the coldplate 38 may include a sublayer 48, a fluid passage 50, and a sublayer 52.

Figure 3:
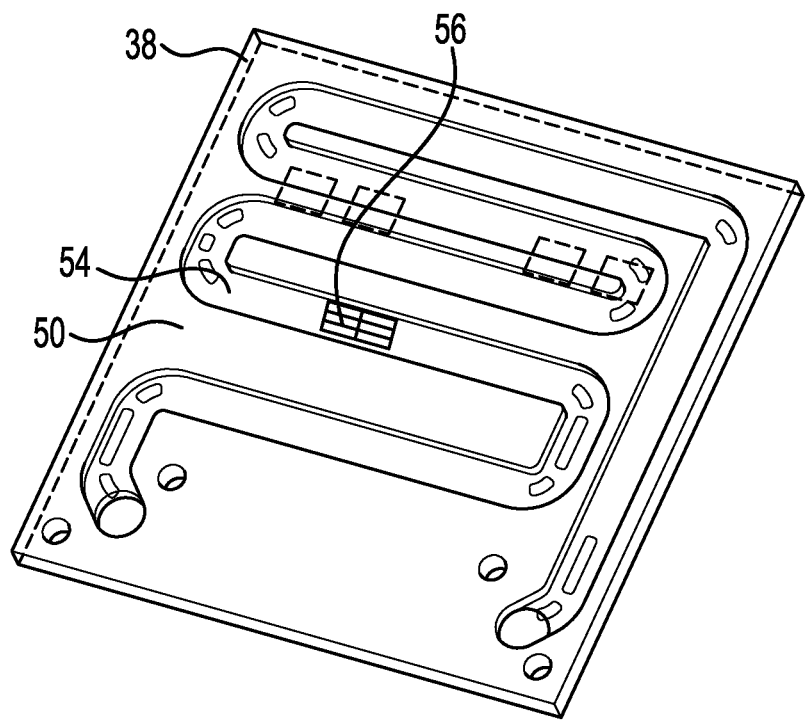
FIG. 3 shows an oblique view of the coldplate of FIG. 2 according to an embodiment of the present application.
Figure 4:
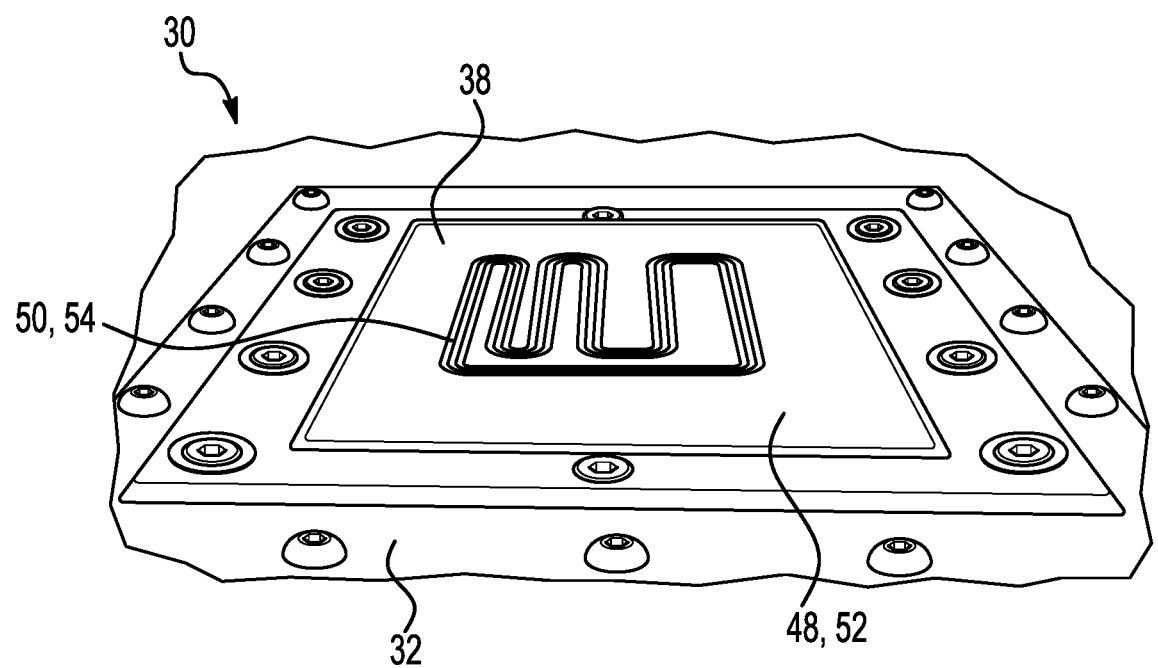
FIG. 4 shows an oblique view of the heat spreader layer and the coldplate of FIG. 2 according to an embodiment of the present application.

Referring in addition to FIGS. 3 and 4, the sublayers 48, 52 of the coldplate 38 are stacked in the build direction 40 and may be formed of a metal material. A first metal sublayer 48 is laminated over the heat spreader layer 32. The first metal sublayer 48 of the coldplate 38 may be laminated over an uppermost sublayer 46 of the heat spreader layer 32 to form an intermetallic bond between the adjacent sublayers 46, 48 of the heat spreader layer 32 and the coldplate 38. The coldplate 38 includes serpentine cooling channels 54 for the working fluid to flow through the coldplate 38, as best shown in FIGS. 3 and 4. The fluid passage 50 is a water or water mixture between the metal sublayers 48, 52.

The serpentine cooling channels 54 may have any suitable shape or path. The serpentine cooling channels 54 may be formed using UAM or the serpentine cooling channels 54 may be machined or milled into the metal of the coldplate 38. The flow passage 50 may be formed between two pieces of metal in the coldplate 38. The second metal sublayer 52 of the coldplate 38 may be laminated over the serpentine cooling channels 54.

The coldplate 38 may have an overall thickness that is greater than an overall thickness of the heat spreader layer 32. In an exemplary embodiment, the coldplate 38 may have a thickness that is between 0.15 millimeters and 5 millimeters thick and the sublayers 48, 52 or aluminum sheets may have thicknesses that are around one millimeter. The sublayers 42, 44, 46 of the heat spreader layer 32 may have thicknesses that are around one millimeter.

The coldplate 38, and sublayers thereof, may be formed of any material or materials suitable for UAM. The material may be a metal material such as aluminum or aluminum alloys. For example, each sublayer 48, 52 of the coldplate 38 may be formed of aluminum. Other materials and alloys including beryllium, copper, germanium, gold, iron, magnesium, molybdenum, nickel, palladium, platinum, silicon and silicon carbide, silver, tantalum, tin, titanium, tungsten, and zirconium may also be suitable. The coldplate 38 may include dissimilar metals, or metals having different material properties, or multi-material laminate materials. Using UAM to form the coldplate 38 is advantageous in using dissimilar metals and multi-material laminates, as compared with conventional manufacturing processes which do not enable use of the same materials that are available for UAM.

In addition to building up or forming the coldplate 38, UAM is advantageous in forming the intermetallic bond between the heat spreader layer 32 and the coldplate 38 to eliminate the use of the intermediate thermal interface material layer 18, as shown in the conventional cooling structure 12 of FIG. 1, and reduce the temperature rise across the entire cooling structure 30. The intermetallic bond formed between the heat spreader layer 32 and the coldplate 38 may occur between any suitable metallic pair. Examples of suitable pairs include aluminum and copper, copper and molybdenum, copper and tungsten, and aluminum and silicon carbide. For example, as shown in FIG. 2, the intermetallic bond may be formed between the first metal sublayer 48 of the coldplate 38 which is formed of aluminum and the adjacent sublayer 46 of the heat spreader layer 32 which is formed of copper.

As schematically represented in FIG. 3, the coldplate 38 may include finstock 56 that is arranged in the serpentine cooling channels 54. Internal or external finstock may be formed on the coldplate 38. The arrangement of the finstock 56 may be selected to achieve a predetermined fin efficiency for a particular application. The fin efficiency is dependent on fin geometry, fin material thermal conductivity, and a heat transfer coefficient at the fin surface. The finstock 56 may be sheet-like in shape and formed of any suitable material. For example, the finstock 56 may be formed of metal materials including laminates of copper and molybdenum, copper and aluminum, copper and tungsten, or aluminum and silicon carbide.

In an exemplary embodiment, UAM or other additive manufacturing processes, such as electron beam melting, may be used to form the finstock 56. Using UAM enables the finstock 56 to be formed of dissimilar metal materials or multi-material laminate materials. Using the finstock 56 is advantageous in providing more efficient heat transfer through the coldplate 38, by way of convection across the finstock 56. Sheets of finstock 56 may be stacked in the build direction 40, as shown in FIG. 2, such that the finstock 56 is stacked in a direction that is both normal to the direction of fluid flow through the serpentine cooling channels 54 and the direction in which the heat-dissipating surface 14 extends, as shown in FIG. 2.

In alternative embodiments, the finstock 56 may be formed using machining or milling. The finstock 56 may be drop-in finstock that is formed separately and permanently joined into the serpentine cooling channels 54 or the finstock 56 may be machined into the serpentine cooling channels 54. Permanently joining the finstock 56 may include using brazing or non-UAM welding. A combination of UAM and machining, brazing, or non-UAM welding may also be suitable. Still other methods or features for increasing the convection coefficient across the coldplate 38 may be suitable. For example, mesh foams may be arranged in the serpentine cooling channels 54. Internal finstock or external fins may be arranged on the coldplate 38.

The heat spreader layer 32 is formed of any suitable heat spreader material and any suitable heat spreader layer may be used. Existing heat spreader structures may be suitable. The heat spreader layer 32 may be a solid-state heat spreader, such as a copper/molybdenum/copper (CMC) heat spreader or a super copper/molybdenum/copper (SCMC) heat spreader. For example, as shown in FIG. 1, the heat spreader layer 32 may include a sublayer 42 of molybdenum sandwiched between sublayers 44, 46 of copper. A thickness of the molybdenum sublayer 42 may be greater than a thickness of the copper sublayers 44, 46. The second side 36 of the heat spreader layer 32 may be arranged on the sublayer 46 and the first side 34 of the heat spreader layer 32 may be arranged on the sublayer 44. The arrangement shown in FIG. 1 is exemplary and other sublayer arrangements or stackups may be suitable. For example, other material combinations may be suitable including copper and diamond, thermal pyrolytic graphite, and other spreader materials.

Figure 5:
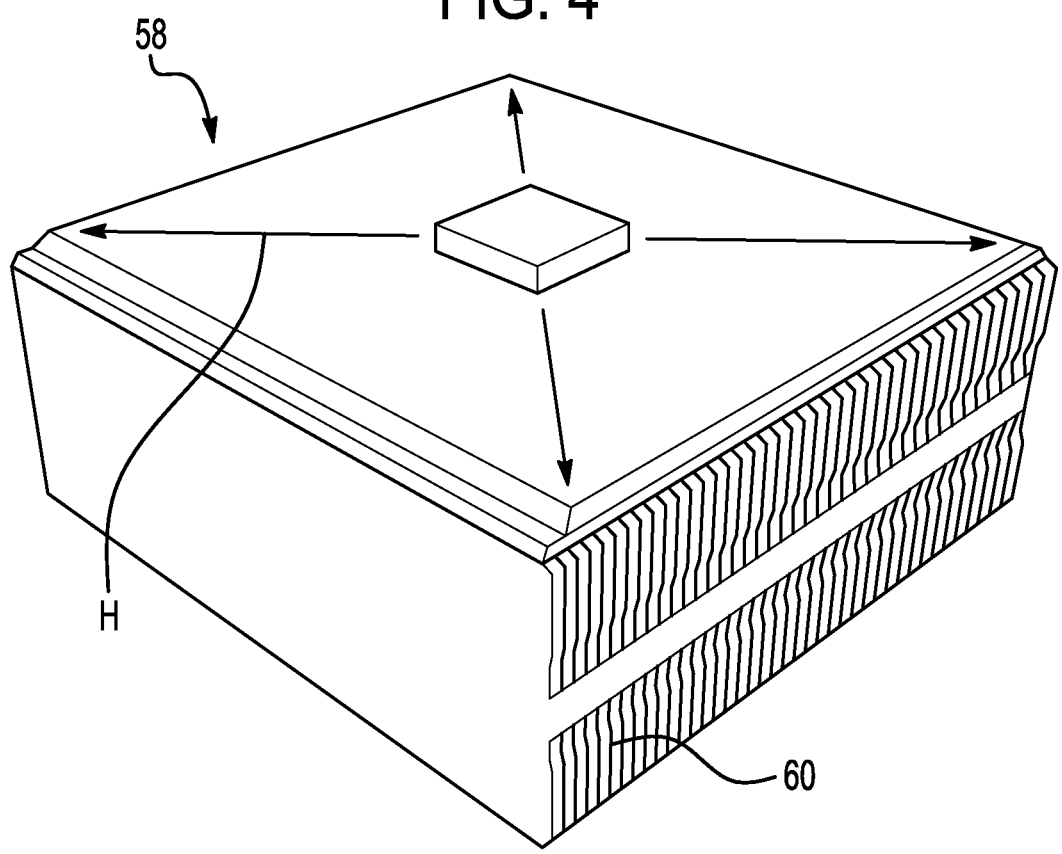
FIG. 5 shows an oblique view of the heat spreader layer of FIG. 2 according to an embodiment of the present application.
Figure 6:
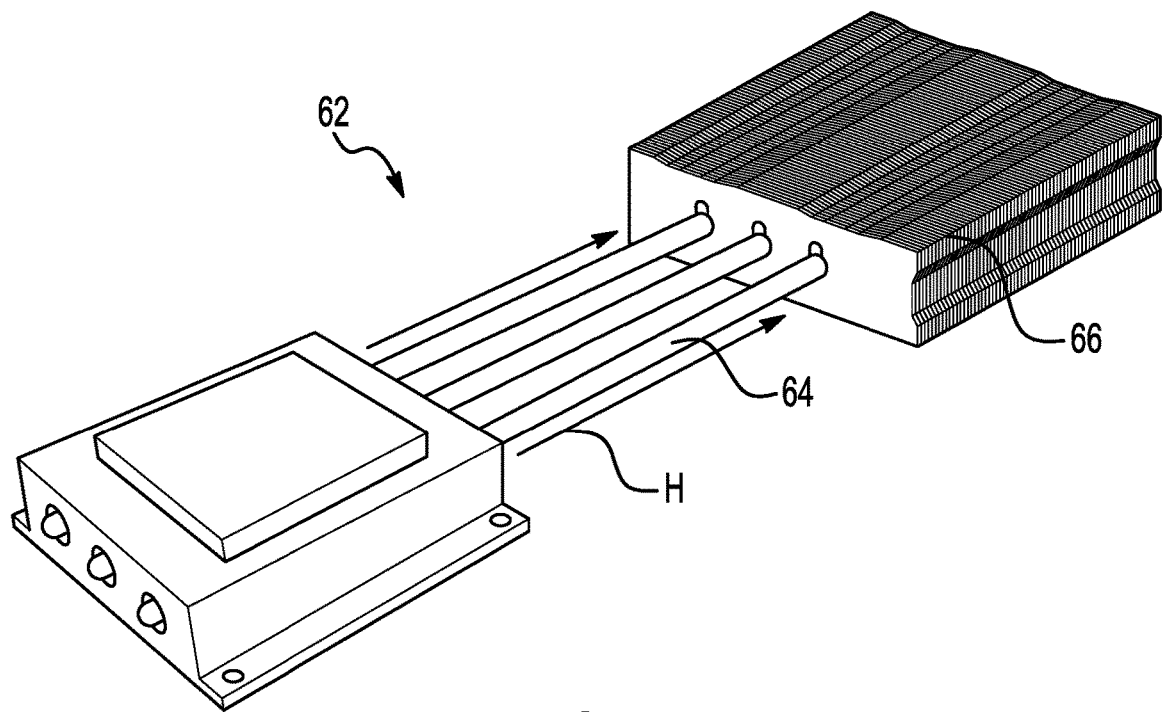
FIG. 6 shows an oblique view of the heat spreader layer of FIG. 2 according to another embodiment of the present application.
Figure 7:
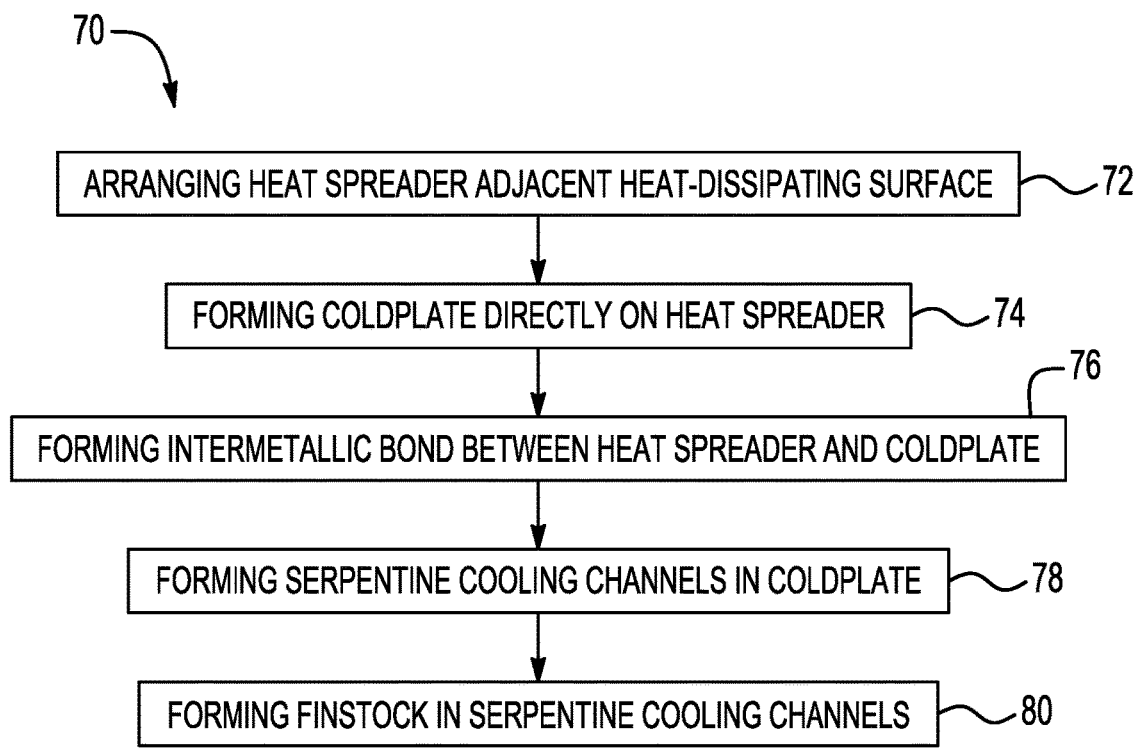
FIG. 7 is a flow chart illustrating a method of forming the cooling structure of FIG. 1.

Referring in addition to FIGS. 5 and 6, in another exemplary embodiment, the heat spreader layer 32 may be a two-phase assembly. As shown in FIG. 5, the heat spreader layer 32 may be a two-phase assembly 58 that spreads heat H to a heat sink 60 or fin stack using vapor chambers with large continuous areas. The vapor chamber may be formed as two stamped plates. As shown in FIG. 6, the heat spreader layer 32 may be a two-phase assembly 62 that moves heat H through pipes 64 to a remote heat sink 66 or fin stack. The pipes 64 may be formed of any suitable material, such as copper. The vapor chambers or pipes may include any suitable wick structure and the two-phase assemblies 58, 62 may be formed of any suitable material.

In still other embodiments of the heat spreader layer 32, the heat spreader layer 32 may be formed to have a specific stackup of sublayers using UAM. The stackup arrangement and materials may be dependent on the application. Using UAM may enable dissimilar metal materials or multi-material laminates to form the heat spreader layer 32. Other non-solid state spreaders may be suitable. For example, other two-phase passive heat spreaders including constant conductance heat pipes, oscillating heat pipes, vapor chambers, or other features may be suitable.

Referring now to FIG. 5, a method 70 of forming the cooling structure 30 for the heat-dissipating surface 14, as shown in FIGS. 2-4, is shown in a flowchart. Step 72 of the method 70 includes arranging the heat spreader layer 32 adjacent the heat-dissipating surface 14. In an exemplary embodiment, arranging the heat spreader layer 32 may include forming or building up the heat spreader layer 32 of a plurality of sublayers 42, 44, 46. The stackup may be formed using UAM. In exemplary embodiments, the heat spreader layer 32 may be a solid-state or two-phase assembly. In an exemplary application, arranging the heat spreader layer 32 includes arranging the heat-spreader layer 32 adjacent an integrated circuit that includes the heat-dissipating surface 14.

Step 74 of the method 70 includes bonding the coldplate 38 directly to the second side 36 of the heat spreader layer 32 that opposes the first side 34 arranged adjacent the heat-dissipating surface 14. Step 74 may include building up the heat spreader layer 32 and the coldplate 38 in a direction that is normal to the heat-dissipating surface 14. Step 76 of the method 70 includes forming an intermetallic bond between the heat spreader layer 32 and the coldplate 38 to eliminate the use of a thermal interface material between the heat spreader layer 32 and the coldplate 38 and reduce a temperature rise through the cooling structure 30, as compared with the conventional cooling structure 12 of FIG. 1 in which the thermal interface material 20 is provided between the coldplate 18 and the heat spreader layer 16.

Bonding the coldplate 38 directly to the heat spreader layer 32 may include using UAM to form layers of dissimilar metals or multi-material laminates. Forming the intermetallic bond may include using bonding materials that include at least two of aluminum, copper, molybdenum, tungsten, aluminum, and silicon carbide and forming a metal-to-metal contact between a metal pair that is one of aluminum and copper, copper and molybdenum, copper and tungsten, and aluminum and silicon carbide. Step 78 of the method 70 includes building up the coldplate 38, such as by UAM, and forming the serpentine cooling channels 54 in the coldplate 38. The coldplate 38 may include the first metal sublayer 48, the flow passage 50 and the serpentine cooling channels 54, and the second metal sublayer 52, which may be a top layer of the entire cooling structure 30.

Forming the coldplate 38 may include forming the first metal sublayer 48 and the second metal sublayer 52 of the same metal material, such as aluminum. Step 80 of the method 70 may include arranging or forming the finstock 56 in the serpentine cooling channels 54. Forming the coldplate 38 may include machining the finstock 56 in the serpentine cooling channels 54 or forming drop-in finstock 56 separately and permanently joining the drop-in finstock 56 in the serpentine cooling channels 54. Forming the finstock 56 may include using UAM and/or machining.

Figure 8:
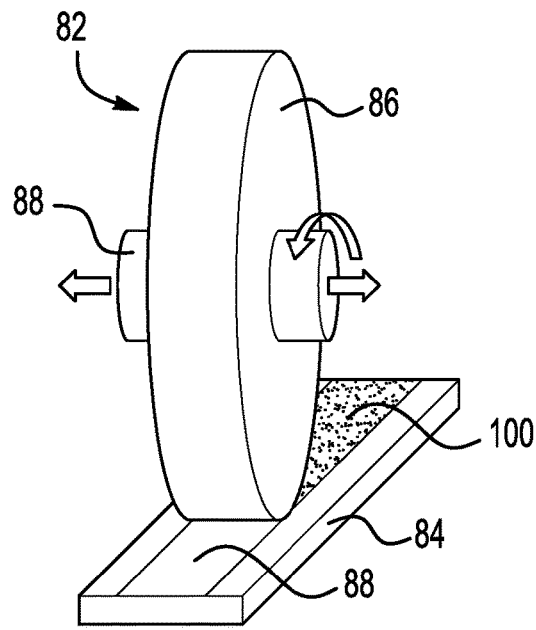
FIG. 8 shows an oblique view of a system for performing a UAM process.
Figure 9:
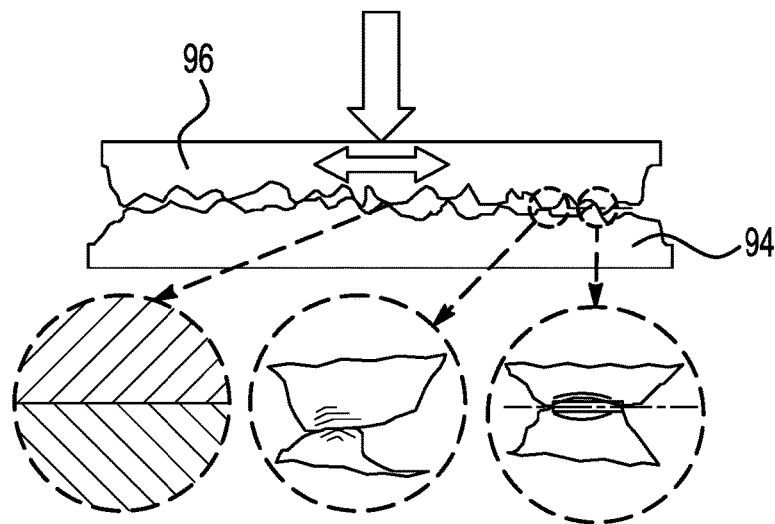
FIG. 9 shows an oblique view of metal tape layers that are merged together during the UAM process.
Figure 10:
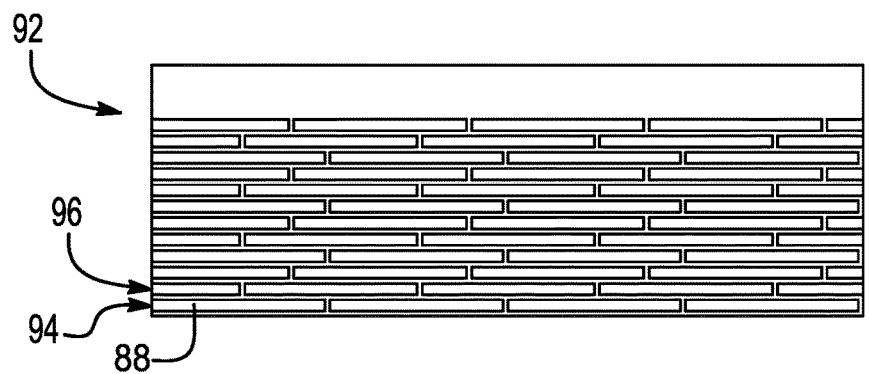
FIG. 10 showing a build-up of tape layers during the UAM process.

Referring in addition to FIGS. 8-10, a system for forming the coldplate 38 (as shown in FIG. 2) is schematically illustrated. FIG. 8 is a schematic drawing of a UAM machine 82. The UAM process may be used to build up the coldplate 38 or the finstock 56 on a base plate 84 that is an existing part or a portion of an existing structure, such as the heat spreader layer 32 on which the coldplate 38 is built up. The base plate 84 may be a heated substrate having a temperature in a range from near ambient room temperature up to 200 degrees Celsius. The UAM machine 82 includes a rotatable sonotrode 86 that travels along a length of a thin metal foil, or tape 88. The sonotrode 86 is used to apply a force normal to the tape 88 to hold the tape 88 to the base plate 84 or another tape.

In an exemplary UAM process, tapes 88 may be laid side-by-side to form a tape layer and this may be repeated to form a plurality of tape layers. After a tape layer is formed, the tape layers may be staggered to form a homogenous structure that does not contain gaps between the tapes. The process may be repeated to form each of the layers of the coldplate 38 and/or the finstock 56. As shown in FIG. 9, the tape layers 94, 96 are merged or welded. The sonotrode 86 may include transducers 98 that produce vibrations to oscillate the sonotrode 86 transversely to the direction of rotation of the sonotrode 86. The sonotrode 86 may oscillate at a constant frequency, around 20 kilohertz, to break oxide layers on the tapes of the tape layers 94, 96 to be adjoined to form a bonded or welded tape 100. FIG. 10 shows the tapes 88 laid side-by-side to form the layers 94, 96. The layers 94, 96 are stacked such that the tapes 88 of each layer are staggered. Each layer is welded or merged to a previously formed layer, such that a homogeneous structure 102 is formed by building up the layers.

Using UAM to directly bond the coldplate to the heat spreader enables optimization of heat transfer from the heat-dissipating surface to the coldplate. Increasing efficiency of the cooling function performed by the cooling structure allows for improved thermal performance of manifold structures used for cooling high power electronics. Applications requiring cooling manifolds may implement fewer manifolds, given the increased efficiency of the cooling structure according to the present application. In aerospace applications such as radars, the manifold structure according to the present application may be implemented to allow radars to operate at a higher energy level due to the improved detection of the radar by increased efficiency of cooling the circuitry.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a cooling structure for a heat-dissipating surface, the method comprising:
    building a heat spreader layer adjacent the heat-dissipating surface in a layer-by-layer process using ultrasonic additive manufacturing in a direction that is normal to the heat-dissipating surface, wherein the heat spreader layer is formed to have a plurality of sublayers;
    bonding a coldplate directly to the heat spreader layer opposite the heat-dissipating surface using ultrasonic additive manufacturing;
    forming an intermetallic bond between the heat spreader layer and the coldplate, wherein forming the intermetallic bond includes forming a metal-to-metal contact between dissimilar metal materials or multi-material laminates;
    forming the coldplate having serpentine cooling channels and building the coldplate over the heat spreader layer built in a layer-by-layer process using ultrasonic additive manufacturing in the direction that is normal to the heat-dissipating surface; and
    arranging finstock in the serpentine cooling channels of the coldplate,
    wherein the heat spreader layer is configured to spread heat prior to cooling with forced convection in the coldplate.

2. The method according to claim 1, wherein forming the metal-to-metal contact includes at least two of aluminum, copper, molybdenum, tungsten, and silicon carbide.

3. The method according to claim 1 further comprising forming a first metal sublayer adjacent the heat spreader layer, a flow passage, and a second metal sublayer layer over the flow passage.

4. The method according to claim 3 further comprising forming the first metal sublayer layer and the second metal sublayer of aluminum laminates.

5. The method according to claim 1 further comprising machining the finstock in the serpentine cooling channels.

6. The method according to claim 1 further comprising separately forming finstock and permanently joining the finstock in the serpentine cooling channels.

7. The method according to claim 1 further comprising arranging the heat spreader layer adjacent an integrated circuit that includes the heat-dissipating surface.

8. The method according to claim 1 further comprising forming at least two of the sublayers of the heat spreader layer to have different thicknesses.

9. A cooling structure for a heat-dissipating surface, the cooling structure comprising:
    a heat spreader layer arranged adjacent the heat-dissipating surface, the heat spreader layer being built up adjacent the heat-dissipating surface in a layer-by-layer process using ultrasonic additive manufacturing in a direction that is normal to the heat-dissipating surface; and
    a coldplate that is bonded directly to the heat spreader layer opposite the heat-dissipating surface using ultrasonic additive manufacturing, wherein the heat spreader layer and the coldplate have an intermetallic bond that is formed of a metal-to-metal contact between dissimilar metal materials or multi-material laminates, the coldplate being built up over the heat spreader layer built in a layer-by-layer process using ultrasonic additive manufacturing in the direction that is normal to the heat-dissipating surface, the coldplate having serpentine cooling channels and finstock arranged in the serpentine cooling channels.

10. The cooling structure according to claim 9, wherein the metal-to-metal contact is between at least two of aluminum, copper, molybdenum, tungsten, and silicon carbide.

11. The cooling structure according to claim 9, wherein the heat spreader layer has a surface area that is greater than the heat-dissipating surface.

12. The cooling structure according to claim 9, wherein the heat spreader layer is a two-phase cooling subassembly including a vapor chamber.

13. The cooling structure according to claim 9, wherein the heat spreader layer is a two-phase cooling subassembly including a heat pipe.

14. The cooling structure according to claim 9, wherein the heat spreader layer is solid-state and includes one of a copper/molybdenum/copper (CMC) heat spreader, a super CMC heat spreader, or a thermal pyrolytic graphite (TPG) heat spreader.

* * * * *